June 24, 1952 T. MURAKAMI 2,601,445

ULTRAHIGH-FREQUENCY STRUCTURE

Filed Feb. 2, 1950

Inventor

TOMOMI MURAKAMI

By H. W. Newton

Attorney

Patented June 24, 1952 2,601,445

UNITED STATES PATENT OFFICE 2,601,445

ULTRAHIGH-FREQUENCY STRUCTURE

Tomomi Murakami, Philadelphia, Pa., assignor to Radio Corporation of America, a corporation of Delaware Application February 2, 1950, Serial No. 142,013

15 Claims. (Cl. 178—44)

This invention relates generally to variable ultra-high frequency tuners and particularly, but not necessarily exclusively, to resonant circuits or structures tunable over an ultra-high frequency range by means of a movable tuning element.

Allocation of frequencies between 500 and 1,000 megacycles to various commercial broadcasting services has enabled the transmission of signal intelligence in the form of modulated carrier waves and television signals within this ultra-high frequency range. Due to the relatively broad band width of the transmitted modulated carrier waves at these frequencies and the wide frequency separation of allocated channels, conventional turned circuits tunable over a range of a few megacycles are not satisfactory at these higher frequencies. Consequently, it has become extremely important for the reception of modulated carrier waves within this portion of the spectrum that resonant circuits be provided which are tunable over a relatively wide range of frequency and operable in the ultra high frequencies portion of the spectrum.

In the past, conventional resonant circuits comprised lumped inductances and capacitances. In the radio and broadcast fields, and particularly at the lower frequencies it is conventional practice to tune a receiver by means of a variable tuning capacitor. These circuits, however, are subject to limitations in tuning range due to an inherent minimum invariable capacitance and the lumped invariable inductance. It has also been found that tuning could be accomplished by means of variable permeability tuning wherein each resonant circuit is tuned wholly or in major part by a ferromagnetic core movable relative to an inductance coil in the circuit, thereby inductively tuning the circuit through a predetermined frequency response range. However, permeability tuning though operable at frequencies of the order of 500 megacycles cannot alone provide tuning at the upper limits of the ultra-high frequency range. Non-magnetic cores of high conductivity also have been used to adjust the frequency of a resonant circuit by means of eddy current tuning. But when used with conventional circuits the upper frequency limit is less than that required for operation in the ultra high frequency range. Accordingly, none of these methods are completely suitable for tuning a resonant circuit in the range of 500 megacycles or above.

A resonant structure comprising distributed inductance and lumped capacitance represented by spaced plates can be tuned by changing the capacitance, as by enclosing a dielectric member between the spaced plates. However, the tuning range of the circuit is limited because the resonant structure has an appreciable fixed minimum capacitance and only the additional capacitance provided by the insertion of the movable dielectric can be tuned.

Other tuning systems not having the limitations of the foregoing tuners have been proposed for use in the ultra high frequencies. However, these have been found to have other disadvantages which render them unsuitable. For example, it has been found that tuning systems such as the Lecher-wire system or parallel wire transmission line having distributed inductance and capacitance can be used to adjust the frequency of an ultra-high frequency oscillation generator. However, since physical contact is necessary to provide tuning of the wires or lines, noise may often occur due to varying contact resistance and such systems or transmission lines often require shielding to reduce radiation from the circuit. Furthermore, the tuning range of transmission line type of resonant structure is limited as only the inductance of the structure is variable.

It is therefore an object of this invention to provide an improved tuning system including a resonant structure effectively operable in the ultra high frequency range with a high degree of uniformity and stability, and having a relatively high efficiency.

It is another object of this invention to provide an improved tuning system including a resonant structure having distributed circuit constants of such a character whereby linearity and tracking are easily attainable.

It is a further object of this invention to provide an improved tuning system including a resonant structure operable in the ultra high frequency range and of such a character that the resonant frequency thereof is variable without the use of sliding contacts.

It is still another object of this invention to provide a simple, inexpensive and compact ultra high frequency variable resonant structure having a low radiation resistance and relatively wide frequency response range.

It is an ancillary object of this invention to provide an improved tuning system including a resonant structure having a minimum of untunable circuit constants arising from connection to other circuit components.

In accordance with the present invention, there is provided a pair of spaced conductive members having distributed inductance and capacitance, such as those described in the more broad aspects in the copending Sands application, Serial No. 142,015 and Murakami application, Serial No. 142,012, both filed concurrently herewith. These spaced conductive members are tapered thereby providing a varying capacitance and inductance along the length of the members. There is further provided a tuning element such as a core movable in proximity to the tapered members but insulated therefrom.

Further, in accordance with the present invention, there may be connected to the tapered members a bifilar winding to reduce the radiation resistance of the tuned circuit and which is also tunable by means of the movable tuning element, and providing a further extension of the frequency response range of the tuning system in which the device is used.

Further, in accordance with the invention there may be provided a pair of conductive strips interconnecting the tunable resonant structure to other circuit components whereby a minimum of untunable inductance is added to the circuit.

There is also provided a wide linkage structure which may be coupled between a tuning element and a unicontrol means to impart movement to the tuning element. Insulating sections are disposed along the linkage structure to insure that the length of any one section of the wire or conductive portion thereof is less than that which would provide a resonant line and also to reduce the tuning element capacitance to ground.

A better understanding of the invention may be had by reference to the following description when read in connection with the drawing in which like reference numerals are used for like parts throughout the figures.

Figures 1, 2, 3, 4, 5, 6, 7:
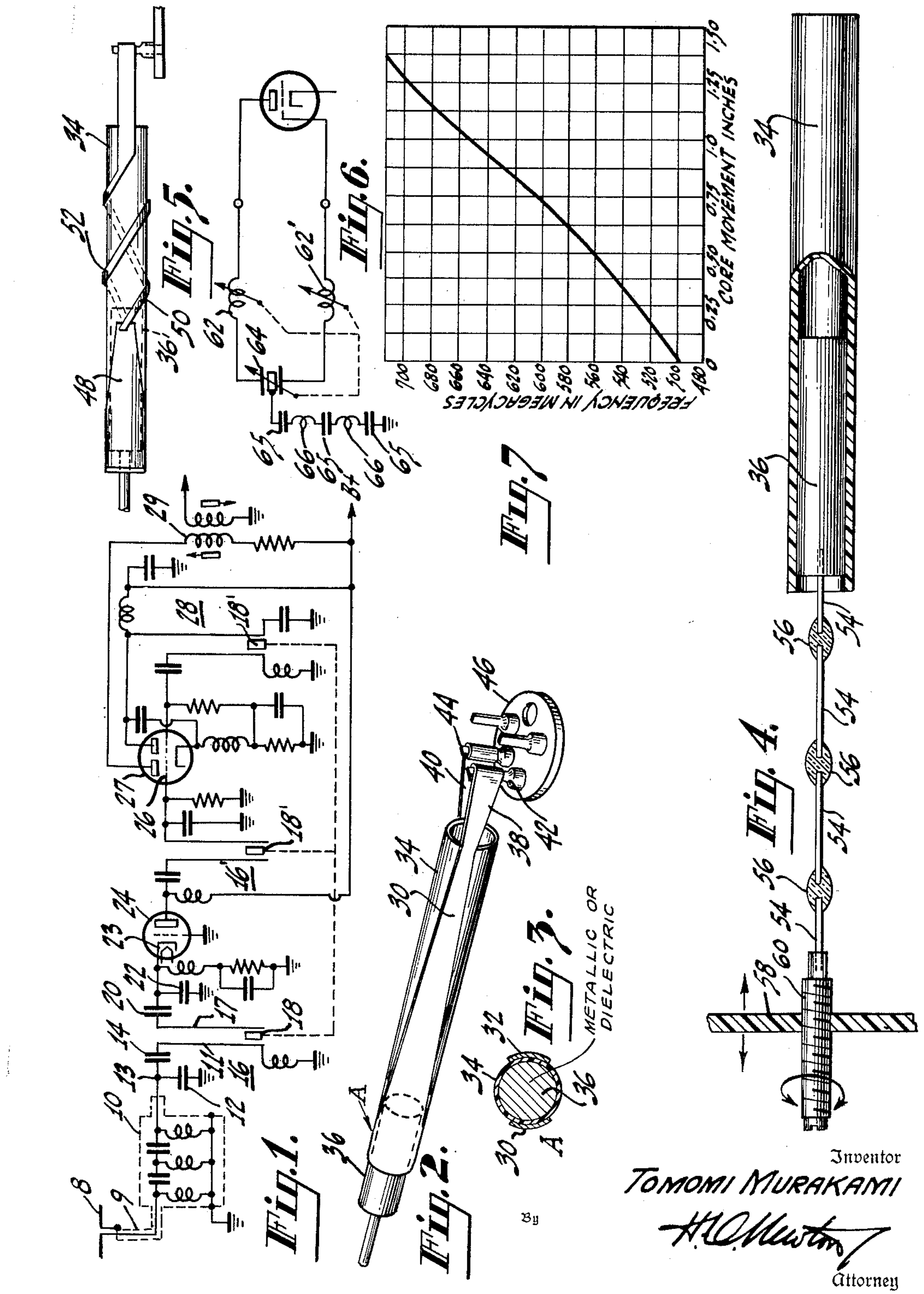
Figure 1 is a schematic circuit diagram of a portion of an ultra-high frequency receiver having tunable circuits constructed in accordance with the present invention.
Figure 2 is a perspective view of a resonant structure as used in the circuit of Figure 1 and embodying the invention.
Figure 3 is a cross-section view of the resonant structure illustrated in Figure 2 taken at one end as indicated at A.
Figure 4 is a side view, partly in section, of a structure illustrating a further embodiment of the invention.
Figure 5 is a side view of a resonant structure illustrating a still further embodiment of the invention, being a modification of the resonant structure shown in Figures 2 and 3 and including bifilar conductive elements.
Figure 6 is a schematic circuit diagram of an equivalent circuit of the tuning means illustrated in the preceding figures of the drawing, being particularly related to Figure 4.
Figure 7 is a graph showing a curve representing the relation between frequency response and core movement in a tuning system as shown in Figure 1.

Referring to Figure 1, there is shown a portion of an ultra high frequency superheterodyne receiver which is one form of apparatus for which the invention is particularly adapted. This apparatus comprises a signal input means which by way of example is illustrated as dipole 8 for receiving modulated carrier wave energy which is conveyed from the dipole through a coaxial cable 9 into a high pass filter designated by the dotted line block 10. This filter shown schematically reduces spurious responses most of which are below 500 megacycles and can be provided in various ways as is well known in the art, but a printed type of circuit is at present preferred.

One member 11 of a tuned resonant structure 16, as provided by the invention, and which will be discussed in detail in connection with the remaining figures, is capacitively coupled to the output terminal 13 of the filter 10 by means of capacitors 12 and 14. These capacitors 12 and 14 provide impedance matching between the filter 10 and the resonant structure 16 and in addition prevent overloading of the resonant structure 16 by the filter 10. The tuned resonant structure 16 is tunable to desired frequencies by means of a movable tuning element or core 18 which may be of conductive material such as copper or brass and may be mechanically coupled with the tuning elements 18′ of other resonant structures within the receiver to provide cooperative movement of all of the tuning elements by means of a single control. The other member 17 of the resonant structure 16 is coupled by capacitors 20 and 22 to the cathode 23 of a grounded grid electron tube 24 illustrated as a triode and used as a radio frequency amplifier stage.

Capacitively coupled to the anode circuit of the discharge tube 24 is a second resonant structure 16′ substantially identical to the first resonant structure 16, and providing selective coupling between the amplifier stage 24 and the first grid 26 of a double triode electron tube 27 used as an oscillator-mixer stage. There is provided a third resonant structure 28 which may be substantially identical to the embodiment of the invention illustrated in Figure 5, and which operates at a frequency below the operating frequency of the other resonant structures 16 and 16′ by an amount equal to the desired intermediate frequency of the system. This resonant structure 28 coupled with the oscillator portion of the double triode electron tube 27 operates as a Colpitts oscillator which is cathode coupled to the mixer section of the electron tube 27. The output of the mixer stage is derived from an impedance 29 which may be the primary winding of an intermediate frequency transformer providing coupling to an intermediate frequency amplifying stage of the receiver, not shown.

One form of the invention is illustrated in Figures 2 and 3 in which tapered members 30 and 32 of conductive foil such as copper are attached to the outer surface of a hollow cylinder 34 of some desirable insulating material such as Bakelite. A tuning element or core 36 is disposed within the hollow cylinder 34 and movable therein to place it in proximity with different portions of the tapered members 30 and 32. The tapered tuning members are not a part of the present invention but are covered in the copending Murakami application, Serial No. 142,012, filed concurrently herewith. The length of this core 36 is somewhat shorter than one-half the length of the tapered members 30 and 32, thereby providing a capacitance across only a portion of the tapered members. Either a metallic or dielectric core may be used to provide this capacitance. This capacitance formed by the tapered members and the core is effectively connected between the tapered members at a point which is variable with core movement. It was found that if this tuning element is made appreciably shorter than one-half the length of the tapered members a wavy type of tuning curve results and if it is made appreciably longer than one-half the length of the tapered members, excessive capacity is introduced into the circuit. At the smaller ends of the tapered members there are preferably provided connecting strips 38 and 40 to enable connection with prongs 42 and 44 of the base or socket 46 of an electron tube. These strips may be of rectangular form or flared as shown thereby providing a larger conductive area reducing the inductance. It is desirable to provide connecting strips having a minimum of inductance since any inductance added to the circuit by these strips is invariable because the tuning element is never enclosed between them. A minimum of additional invariable inductance in the circuit allows tuning of the major portion of the inductance of the circuit and enables the attainment of higher resonant frequencies.

The diameter of the core member 36 may be almost equal to the inner diameter of the insulating cylinder 34 as shown in Figure 3. It has been found in practice that a cylinder having a wall thickness of about 10 mils and an air gap of about 1 mil between the core member and the tube wall will provide the necessary capacitance for tuning such a circuit.

It is well known that the capacitance of a capacitor is directly proportional to the area of the capacitor plates and the dielectric constant of the material between the plates, and, inversely proportional to the distance between the plates. It is readily seen, therefore, that there exists between each of the tapered members and the core a variable capacitance of a magnitude which is determined primarily by the position of the core along the cylinder. This is true because the spacing of the capacitor plates as well as the dielectric constant of the insulating cylinder remains substantially constant and the capacitance is changed due to the varying area of the tapered members 30 and 32 which will be adjacent to the core 36 in its different positions within the cylinder 34.

It is evident that each tapered member also has inductance which is distributed along its length and that the distributed inductance per unit of length is nonuniform due to the varying conductive area provided by the tapered form. Tuning of the resonant structure is primarily due to the change of inductance as the effective capacitive reactance between the tapered members is moved along the members thereby utilizing a lesser or greater portion of the length of the members. The tapered members are physically somewhat less than a quarter wave length of the resonant frequency which enables the use of a more compact structure than would be required if a Lecher wire system or tuned transmission line were used. In electrical operation the structure provided by the invention offers a relatively high impedance to a tube connected thereto but does not function as a quarter wave tuned line in which tuning is provided by merely changing the length of a quarter wave length section of a parallel line and in which a low impedance short exists at that end of the line not connected to a discharge tube.

In Figure 5 there is represented an embodiment of the invention which finds its primary use as an oscillator tank circuit such as the resonant structure 28 in the oscillator portion of Figure 1. A tapered member 48 is attached to the outer surface of the hollow cylinder 34. It is to be understood that there is a second tapered member located diametrically opposite to the section 48 as shown. These tapered members provide a capacitance in combination with the core 36, which varies as the core, shown by dotted lines within the cylinder 34, is moved therebetween in the manner previously described. It is to be noted that the length of these tapered members is somewhat less than one-half of the length of the insulating supporting cylinder 34. Physically connected to the tapered members are the two conductors 50 and 52 of a bifilar winding.

The advantages obtained by the use of this bifilar winding are: the amount of inductance change available with a predetermined core movement is extended as there exists in this type of winding a greater inductance per unit length than exists in the embodiment shown in Figure 2; and further, the radiation resistance of the oscillator tank circuit is reduced due to mutual cancellation of the fields surrounding each conductor and consequently, interference normally caused by local radiation is reduced.

As illustrated in Figure 1, a plurality of cores is mechanically connected so that by means of a single control element all of the cores may be simultaneously moved to provide tuning of the system to the desired frequency. In Figure 4 there is shown a core 36 movable within a cylinder 34 by means of a tuning linkage comprising the wire sections 54 which have insulating beads 56 of suitable insulating material such as glass interposed therebetween. It is to be understood that the use of the glass beads 56 as insulating material between the conductive wire section 54 is merely illustrative and that any other suitable insulating material such as a plastic resin can be used. The outer end of the tuning linkage is adjustably connected to a ganging carriage member 58 by a threaded screw 60 thereby allowing adjustment of the distance between the core and the carriage by rotation of the screw as illustrated. It is to be understood that other cores of other resonant structures of the apparatus will be coupled to the carriage in a similar manner and that the form shown is merely illustrative of one possible method of mechanical coupling. The use of Kovar wire in such a linkage is advisable, or other wire having a very low coefficient of thermal expansion since therefore oscillator drift due to thermal expansion of such a linkage is minimized. And further, the flexibility of the linkage provided by the use of wire allows the cores to properly align themselves within the cylinder. It is necessary to interpose the insulating portions 56 between the conductive wire sections 54 to decouple the core and the wire sections from the surrounding metal such as a chassis to avoid the danger of providing resonant circuits formed by the linkage and its capacitance to the chassis or ground.

Figure 6 schematically represents the equivalent electrical circuit of Figure 4. The mechanically coupled variable inductances 62 and 62′ and capacitor 64 are representative of the distributed inductance and capacitance of the tapered members variable by movement of the core 36. Capacitors 65 schematically represent the resulting capacitances as provided by the wire linkage when made electrically discontinuous by the glass beads 56. It is readily seen that since these three small capacities are connected in series the resulting capacitance to ground of the circuit is substantially reduced. Inductances 66 schematically represent the inductance per se of each of the Kovar wire sections 54.

In Figure 7 there is graphically represented the resulting tuning curve of a resonant structure as provided by the invention. It is readily seen that this characteristic is substantially linear thereby enabling smooth tuning throughout the desired range with a substantially equal frequency increment per unit of core movement from one end of the tuning range to the other.

In one embodiment of the invention successfully used in connection with a tuner operating between 500 and 700 megacycles the two tapered members 30 and 32 were 2¾ inches long and ⅜ of an inch wide at the large end. This provided a tuning curve substantially as illustrated in Figure 7. The oscillator element constructed in accordance with Figure 5 utilized a tapered member approximately 1¼ inches in length and a bifilar winding approximately 1$\frac{1}{16}$ inches in length. It was found that by using the single tapered members of Figure 2 in the radio frequency amplifier and mixer stages and the composite tapered section and bifilar winding of Figure 5 in the oscillator stage, proper tracking could be provided over the entire tuning range.

There has thus been described a resonant structure effectively operable in the ultra high frequency portion of the spectrum with a high degree of stability and efficiency and having a minimum of invariable circuit constants. This structure provides a wide range of tuning and is of such character that low radiation resistance, tracking and linearity are easily attainable.

What is claimed is:

1. A resonant structure tunable within an ultra high frequency range, comprising a pair of tapered conductive members in fixed spaced relation, a pair of conductors arranged in bifilar relation and connected to said tapered members, and a tuning element movable relative to said tapered members and said bifilar conductors, whereby the resonant frequency of said structure is adjustable.

2. A resonant structure tunable within an ultra high frequency range comprising a pair of conductive members in fixed spaced substantially parallel relation and having a width varying along their length, a pair of conductors arranged in bifilar relation and connected to said tapered members, and a conductive tuning element movable relative to said tapered members and said bifilar conductors, whereby the resonant frequency of said device is adjustable.

3. A resonant structure tunable within an ultra high frequency range, comprising a support, a pair of tapered conductive members mounted on said support in fixed spaced relation, a pair of conductors arranged in bifilar relation and connected to said tapered conductive members, and a movable tuning control element comprising a body of material having properties effective to alter the electrical circuit constants of said structures thereby changing the electrical response characteristics.

4. A resonant structure tunable within an ultra high frequency range, comprising an insulating support, a pair of tapered conductive members mounted in fixed spaced relation on and extending along a portion of said insulating support, a pair of conductors connected to said tapered conductive members and arranged in bifilar relation along the remaining portion of said insulating support, and a movable tuning element comprising a body of material having properties effective to alter the electrical circuit constants of said structure thereby changing the electrical response characteristics.

5. A resonant structure tunable within an ultra high frequency range, comprising a support of insulating material, a pair of tapered conductive members mounted in fixed spaced relation on and extending along a portion of said support, a pair of conductors connected to said tapered conductive members and arranged in bifilar relation along the remaining portion of said support, and a core movable relative to and between said tapered elements and said bifilar elements whereby the resonant frequency of the structure is adjustable within a predetermined frequency range.

6. A resonant structure tunable within an ultra high frequency range, comprising a tubular support of insulating material, a pair of tapered conductive members mounted in fixed spaced relation on and extending along a portion of said support, a pair of conductors connected to said tapered members and arranged in bifilar relation along a further portion of said support, and a tuning element of dielectric material slidably mounted within said support and movable relative to said tapered members and said conductors, whereby the resonant frequency of the structure is adjustable within a predetermined frequency range.

7. A resonant structure tunable within an ultra high frequency range, comprising a tubular support of insulating material, a pair of tapered conductive members mounted in fixed spaced substantially parallel relation on and extending along a portion of said support, a pair of conductors connected to said tapered members and arranged in bifilar relation along a further portion of said support, and a core slidably mounted within said tubular support and movable relative to said tapered members and said bifilar conductors, whereby the resonant frequency of the circuit is adjustable within a predetermined frequency range.

8. A resonant structure tunable within an ultra high frequency range, comprising a tubular support of insulating material, a pair of tapered conductive members mounted in fixed spaced relation on and extending along a portion of said supporting member, a pair of conductors connected to the smaller ends of said pair of tapered members and arranged in bifilar relation along the remaining portion of said support, and a tuning element slidably disposed within said support and movable relative to said tapered members and said conductors, whereby the resonant frequency of the structure is adjustable within a predetermined frequency range.

9. A resonant structure tunable within an ultra high frequency range, comprising a tubular support of insulating material, a pair of tapered conductive members mounted in fixed spaced substantially parallel relation on and extending along a portion of said support, a pair of conductors connected to the smaller ends of said pair of tapered members and arranged in bifilar relation along the remaining portion of said support, and a conductive tuning element slidably disposed within said support and movable relative to said tapered members and said conductors, whereby the resonant frequency of the structure is adjustable within a predetermined frequency range.

10. A resonant structure tunable within an ultra high frequency range, comprising in combination, a tuning element movable along a fixed path, a pair of tapered conductive members arranged along and outside a portion of said path in fixed spaced relation, a pair of conductors connected to said pair of tapered members and disposed in bifilar arrangement along and outside a further portion of said path, and connecting strips secured to said bifilar elements for providing a minimum of additional inductance and adapted to provide circuit connections for the structure.

11. A resonant structure tunable within an ultra high frequency range, comprising in combination, a conductive tuning element movable along a fixed path, a pair of tapered conductive members arranged along and outside a portion of said path in fixed spaced relation, a pair of conductors disposed in bifilar arrangement along and outside a further portion of said path and connected to said tapered members and flared connecting strips secured to said conductors for providing a minimum of additional inductance and adapted to provide electrical connections for structure, a carriage means for moving said tuning element, a tuning linkage including a plurality of conductive segments having a relatively low coefficient of thermal expansion, and a plurality of electrical insulators mechanically connected between said conductive segments to form a physically continuous and electrically discontinuous rod like linkage connecting said tuning element to said carriage means, whereby the resonant frequency of said structure may be altered by movement of said carriage means.

12. A resonant structure tunable within an ultra high frequency range comprising in combination, a hollow tubular support of insulating material, a pair of tapered conductive members mounted in fixed spaced relation and extending along a portion of said support, a pair of conductors connected to said pair of tapered members and disposed in bifilar arrangement along and outside a further portion of said support, and flared connecting strips secured to said conductors for providing a minimum of additional inductance and adapted to provide electrical connections for resonant structure, a core slidably disposed within said support, a carriage for moving said core, a tuning linkage including a plurality of conductive segments having a relatively low coefficient of thermal expansion, and a plurality of glass bead insulators mechanically connected between said conductive segments to form a physically continuous and electrical discontinuous rod like linkage connecting said core to said carriage, whereby the resonant frequency of said structure may be altered by movement of said carriage.

13. In a tunable resonant structure for ultra high frequency circuits, a tuning element movable with respect to said structure and along a path substantially parallel to the axis of said structure, carriage means movable with respect to said structure along a relatively fixed path for moving said tuning element, a movable tuning linkage including a plurality of conductive segments providing inductance in said linkage, and electrical insulators mechanically connected between said conductive segments to form a physically continuous flexible rod-like linkage connecting said tuning element to said carriage means, said insulators effectively providing a plurality of serially connected capacitances between said segments, and said capacitances and said inductance being resonant to a frequency outside of the operating frequency range of said structure, whereby said tuning element is decoupled from said carriage over said operating frequency range.

14. In a tunable resonant structure for ultra high frequency circuits, a tuning element movable with respect to said structure and along a path substantially parallel to the axis of said structure, carriage means movable with respect to said structure along a relatively fixed path for moving said tuning element, a movable tuning linkage including a plurality of conductive segments having a low co-efficient of thermal expansion providing inductance in said linkage, and electrical insulators mechanically connected between said conductive segments to form a physically continuous flexible rod-like linkage connecting said tuning element to said carriage means, said insulators effectively providing a plurality of serially connected capacitances between said segments, and said capacitances and said inductance being resonant to a frequency outside of the operating frequency range of said structure, whereby said tuning element is decoupled from said carriage over said operating frequency range.

15. In a tunable resonant structure for ultra high frequency circuits, a tuning element movable with respect to said structure and along a path substantially parallel to the axis of said structure, carriage means movable with respect to said structure along a relatively fixed path for moving said tuning element, a movable tuning linkage including a plurality of conductive segments having a low co-efficient of thermal expansion providing inductance in said linkage, and glass bead insulators mechanically connected between said conductive segments to form a physically continuous flexible rod-like linkage connecting said tuning element to said carriage means, said insulators effectively providing a plurality of serially connected capacitances between said segments, and said capacitances and said inductance being resonant to a frequency outside of the operating frequency range of said structure, whereby said tuning element is decoupled from said carriage over said operating frequency range.

TOMOMI MURAKAMI.

REFERENCES CITED

The following references are of record in the file of this patent:

UNITED STATES PATENTS

| Number | Name | Date |
|---|---|---|
| 1,002,051 | Fessenden | Aug. 29, 1911 |
| 2,401,489 | Lindenblad | June 4, 1946 |
| 2,409,321 | Stephan | Oct. 15, 1946 |
| 2,512,945 | Kallman | June 27, 1950 |